United States Patent [19]
Ogihara et al.

[11] Patent Number: 5,917,227
[45] Date of Patent: Jun. 29, 1999

[54] LIGHT-EMITTING-DIODE ARRAY AND LIGHT-EMITTING-DIODE ELEMENT

[75] Inventors: Mitsuhiko Ogihara; Yukio Nakamura; Masumi Taninaka; Hiroshi Hamano, all of Tokyo, Japan

[73] Assignee: Oki Electric Industry Co., Ltd., Tokyo, Japan

[21] Appl. No.: 08/924,832

[22] Filed: Sep. 5, 1997

[30] Foreign Application Priority Data

Oct. 28, 1996 [JP] Japan ..................................... 8-285528

[51] Int. Cl.⁶ ...................................................... H01L 27/14
[52] U.S. Cl. .......................... 257/443; 257/189; 257/200; 257/201; 257/233; 257/226; 257/481; 257/482; 257/257; 257/290; 257/292; 257/461; 257/603; 257/604; 257/656
[58] Field of Search ..................................... 257/104, 109, 257/175, 189, 200, 201, 233, 226, 288–294, 481, 482, 601–604, 656, 901, 257, 461, 443

[56] References Cited

U.S. PATENT DOCUMENTS

| | | | |
|---|---|---|---|
| 4,980,749 | 12/1990 | Ohtuska et al. | 257/200 |
| 5,105,249 | 4/1992 | Bierhoff et al. | 257/462 |
| 5,107,317 | 4/1992 | Takasaki | 257/200 |
| 5,296,717 | 3/1994 | Valster et al. | 257/13 |

FOREIGN PATENT DOCUMENTS 63-170142  11/1988  Japan .

*Primary Examiner*—Fetsum Abraham
*Attorney, Agent, or Firm*—Venable; Robert J. Frank; Allen Wood

[57] ABSTRACT

A light-emitting-diode array includes a non-doped compound semiconductor layer between a substrate and a first compound semiconductor layer. A plurality of isolation regions extend from the first compound semiconductor layer to the surface of the non-doped compound semiconductor layer, and provide separation into isolated block regions each containing an equal number of diffusion regions. A plurality of shared electrode lines are connected to the diffusion regions in a plurality of the block regions, in such a relationship that diffusion regions selected from each of the block regions are connected to a common shared electrode. At least a surface portion of the substrate is formed of silicon. The density of the diffusion regions can be increased without increasing the number of the electrode pads. Moreover, the substrate is free from breakage or cracks.

16 Claims, 5 Drawing Sheets

LIGHT-EMITTING-DIODE ARRAY AND LIGHT-EMITTING-DIODE ELEMENT

BACKGROUND OF THE INVENTION

The present invention relates to a light-emitting-diode array and a light-emitting-diode element used in this light-emitting-diode array.

A conventional light-emitting diode (LED) array is disclosed in a publication, "Design of an Optical Printer" Triceps WS 6, 1985, pp. 121–126. The structure of the conventional LED array will be briefly described with reference to FIG. 6A and FIG. 6B.

In a conventional LED array 50, an n-type GaAsP layer 52 is formed on an n-type GaAs substrate 51, and a diffusion mask 54 having apertures is formed on the n-type GaAsP layer 52. P-type diffusion regions 56 are formed in the n-type GaAsP layer 52, by diffusion through the apertures of the diffusion mask 54.

P-type electrodes 58 are provided to extend on the surface of the diffusion mask 54 and the p-type diffusion regions 56. An n-type electrode 60 is provided on the under side of the substrate 51.

The diffusion regions 56 form pn junctions for emitting light and are arranged to form a row. Each chip is separated by dicing from a wafer. The p-type electrodes 58 are in contact with the corresponding diffusion regions 56.

The conventional LED array 50 encounters a limitation on the density of the diffusion regions, and hence light-emitting-diodes, because of the limitations on the density of the electrode pads.
(1) Where a high-density LED array of, for instance, 1200 DPI is formed, if the electrode pads (also called bonding pads) connected to the diffusion regions and the LEDs are disposed in one-to-one relationship, the density of the electrode pads becomes too high, and the electrode lines cannnot be formed on the surface of the n-type GaAsP layer 52.
(2) Where the density of the p-type electrodes becomes high, the size of the electrode pads must be reduced, and the connection between the electrode pads and the driver IC by means of bonding wires or the like becomes difficult.

Accordingly, it has been desired to realize an LED array permitting the diffusion regions to be formed at a higher density.

Another problem associated with the prior art is that the n-type GaAsP layer 52 and the substrate 51 are electrically connected.

SUMMARY OF THE INVENTION

An object of the invention is to provide a light-emitting-diode array which permits the diffusion regions to be formed at a higher density.

Another object of the invention is to provide a light-emitting-diode array having a substrate which is free from breakage or cracks during dicing of the wafer.

A further object of the invention is to provide a light-emitting-diode element having light-emitting regions electrically isolated from the substrate.

A light-emitting-diode (LED) array according to a first aspect of the invention comprises:
a substrate;
a first compound semiconductor layer of a first conductivity type on said substrate;
diffusion regions of a second conductivity type provided in the first compound semiconductor layer to form a light-emitting region;
a non-doped compound semiconductor layer interposed between the substrate and the first compound semiconductor layer;
a plurality of isolation regions extending from the first compound semiconductor layer at least to the surface of the non-doped compound semiconductor layer, and separating the first compound semiconductor layer into block regions which contains an identical number of said diffusion regions and which are electrically isolated from each other; and
a plurality of shared electrode lines connected to the diffusion regions in a plurality of the block regions via individual electrodes, in such a manner that the diffusion regions selected one each from the respective block regions are connected to one shared electrode line;
wherein at least a surface portion of said substrate is formed of silicon.

According to the first aspect of the invention, there are provided the non-doped compound semiconductor layer on the substrate and the isolation regions for separation into block regions including diffusion regions. It is therefore possible to separate and divide the first compound semiconductor layer into a plurality of block regions. The diffusion regions selected one each from the respective block regions are connected to a shared electrode line via the electrodes of the second conductivity type, e.g., the p-type electrodes.

Accordingly, it is not necessary to provide electrode lines in the same number as the diffusion regions, and the number of the bonding pads connected to the diffusion regions can be reduced, and hence the number of lines connecting the bonding pads to the diffusion regions can also be reduced.

As a simple example, let us assume that the LED array in one chip comprises sixteen diffusion regions, and each block region contains four diffusion regions. The diffusion regions selected one each from the respective block regions are connected via p-type electrodes to a shared electrode line. The number of electrode pads for connection with a driver IC is reduced to (the number of the diffusion regions in each block region)/(the number of the diffusion regions in one chip)=4/16=¼, compared with the prior art.

Even if the density of the diffusion regions becomes high, the number of the electrode pads can be reduced, and the formation of the electrode lines is facilitated. For instance, even for an LED array of 1200 DPI, there is a sufficient space for the electrode lines, and the connection of the p-type electrode pads of the LED array and the driver IC is facilitated.

Furthermore, because at least the surface portion of the substrate is formed of silicon, it is possible to avoid breakage or cracks of the substrate during dicing. Moreover, the dicing dicing speed can be increased, and the throughput can be improved substantially.

The isolation regions are preferably formed of isolation channels filled with an insulating material, and having a depth extending from said first compound semiconductor layer to said non-doped compound semiconductor layer, or of first isolation regions of a second conductivity type different from said first conductivity type of said first compound semiconductor layer, and a second isolation region formed by diffusing an impurity of the second conductivity type in said non-doped compound semiconductor layer.

Thus, the isolation regions are formed of isolation channels or combinations of first and second isolation regions separating the first compound semiconductor layer. For this reason, when a voltage is applied to a shared electrode line and a block electrode to cause an electric current to flow in the first compound semiconductor layer, causing the diffusion region in the first compound semiconductor layer to emit light, no current flows from one block to another (which is separated from said one block), and the first compound semiconductor layer can be electrically separated into the plurality of the block regions.

A light-emitting-diode element according to a second aspect of the invention comprises:

a substrate;

a first compound semiconductor layer of a first conductivity type on said substrate;

a diffusion region of a second conductivity type provided in the first compound semiconductor layer to form a light-emitting region; and at least one non-doped compound semiconductor layer provided between the substrate and the first compound semiconductor layer.

Thus, there is provided at least one non-doped compound semiconductor layer between the substrate and the first compound semiconductor layer. Accordingly, the substrate and the first compound semiconductor layer are insulated and isolated.

The non-doped compound semiconductor layer is preferably formed of a two-layer structure comprising a non-doped GaAs layer and a non-doped $Al_yGa_{1-y}As$ layer (where y represents the composition ratio and has a value satisfying 0<y<1) disposed on the substrate in the stated order.

By using the two-layer structure for the non-doped compound semiconductor layer, the insulation between the substrate and the first compound semiconductor layer can be further improved.

DETAILED DESCRIPTION OF THE PREFERRED EMBODIMENTS

Embodiments of a light-emitting-diode (LED) array and an LED element used therein according to the invention will now be described with reference to the drawings. FIG. 1 to FIG. 5 show the shape, size and disposition of the respective components only schematically to enable understanding of the invention.

First Embodiment

Figure 1:
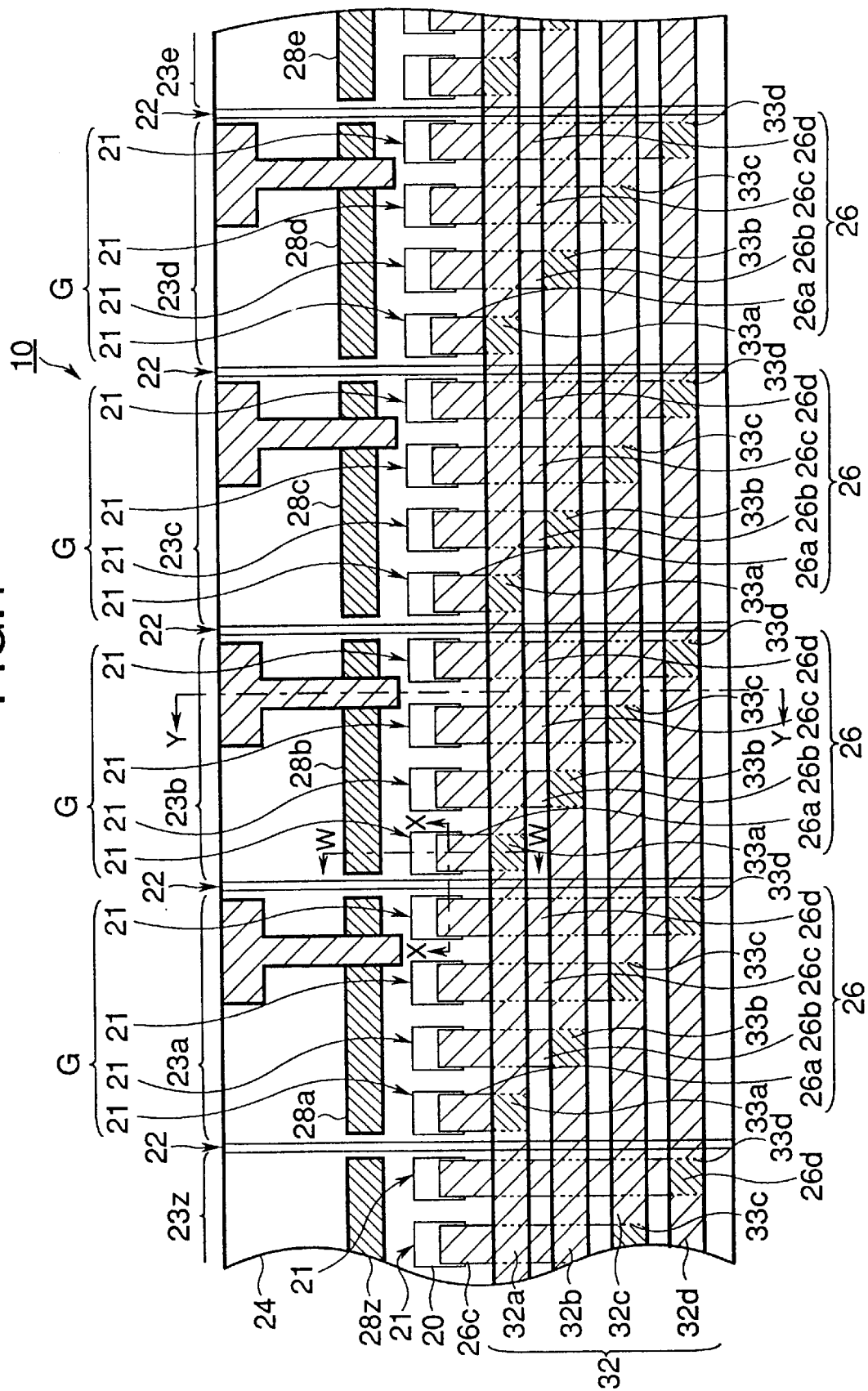
FIG. 1 is a plan view showing an LED array of the invention.

Referring to FIG. 1 to FIG. 4, an LED array according to an embodiment of the invention will be described. FIG. 1 is a plan view showing the LED array with the interlayer insulating film removed. FIG. 2A is a sectional view along line W—W in FIG. 1, FIG. 2B is a sectional view along line X—X in FIG. 1, and FIG. 2C is a sectional view along line Y—Y in FIG. 1. In each of FIG. 2A, FIG. 2B and FIG. 2C, the interlayer insulating film is shown. FIG. 2A illustrates the structure for connecting the diffusion region and the p-type electrode, FIG. 2B illustrates the structure of the diffusion region, and FIG. 2C illustrates the structure for connecting the diffusion region and the block electrode. The hatching in FIG. 1 does not indicate a cross section but indicates regions of the respective components.

Figure 2A:
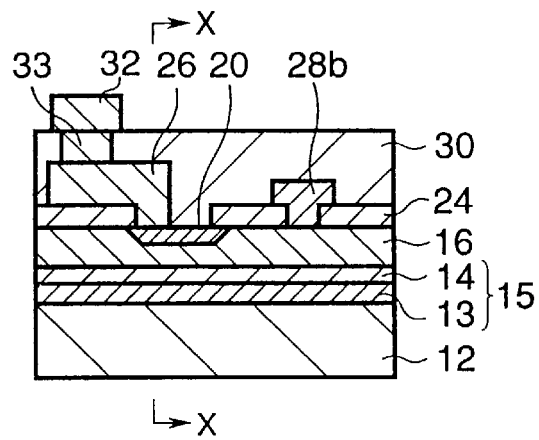
FIG. 2A is a sectional view taken along line W—W in FIG. 1.
Figure 2B:
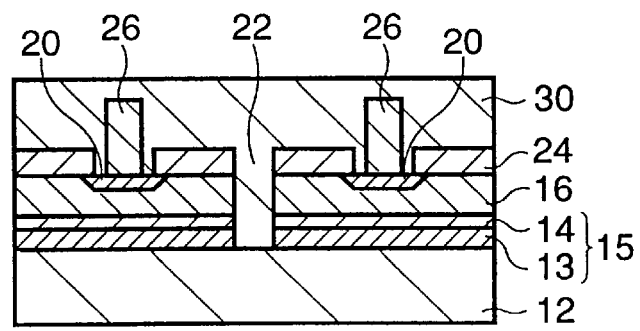
FIG. 2B is a sectional view taken along line X—X in FIG. 1.
Figure 2C:
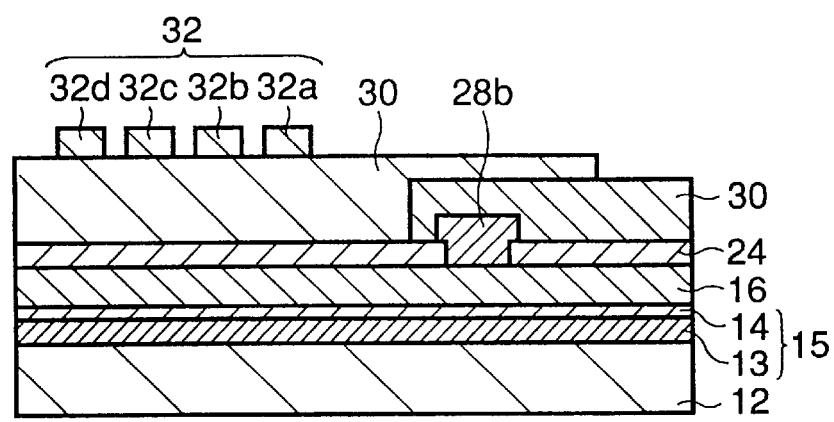
FIG. 2C is a sectional view taken along line Y—Y in FIG. 1.

An LED array 10 of the first embodiment illustrated in FIG. 1 to FIG. 4 comprises a substrate 12 which is formed of an n-type silicon of a high resistance (FIG. 2A, FIG. 2B and FIG. 2C).

A non-doped compound semiconductor layer 15 is provided on the n-type silicon substrate 12. The non-doped compound semiconductor layer 15 is formed of two layers consisting of a non-doped GaAs layer 13 formed on the substrate 12, and a non-doped $Al_yGa_{1-y}As$ layer (where y represents the composition ratio satisfying 0<y<1) 14 formed on the non-doped GaAs layer 13, as shown in FIG. 2A, FIG. 2B and FIG. 2C.

A first compound semiconductor layer 16 of the first conductivity type is formed on the non-doped compound semiconductor layer 15. Specifically, the first conductivity type is n-type, and the first compound semiconductor layer 16 is an n-type $Al_xGa_{1-x}As$ layer (where x represents the composition ratio satisfying 0<x<1).

A plurality of p-type diffusion regions 20 are formed in the n-type $Al_xGa_{1-x}As$ layer 16. The diffusion regions 20 are arranged to form a row. The diffusion regions 20 are formed by diffusion of an impurity, such as zinc (Zn).

The n-type $Al_xGa_{1-x}As$ layer 16 and the p-type diffusion regions 20 are of opposite conductivity types, so pn junctions are formed at the interfaces between them. One diffusion region 20, one pn junction and the immediately adjacent part of the n-type $Ax_xGa_{1-x}As$ layer 16 constitute a single light-emitting diode or region 21.

The GaAs layer 13 provided on the n-type silicon substrate 12 serves as a buffer layer to alleviate the stress generated in the n-type $Al_xGa_{1-x}As$ layer 16 due the difference in the thermal expansion coefficient and the lattice constant between the silicon substrate 12 and the n-type $Al_xGa_{1-x}As$ layer 16, to thereby prevent crystal defects and cracks in the n-type $Al_xGa_{1-x}As$ layer 16.

According to the embodiment, the $Al_yGa_{1-y}As$ layer (y>x, for example y=0.25) 14 is provided on the non-doped GaAs layer 13, to provide insulation between the n-type silicon substrate 12 and the n-type $Al_xGa_{1-x}As$ layer 16. The thickness of the GaAs layer 13 is about 1 µm, and the thickness of the $Al_yGa_{1-y}As$ layer 14 is about 0.5 µm (FIG. 2A, FIG. 2B and FIG. 2C).

The Al composition ratio x of the n-type $Al_xGa_{1-x}As$ layer 16 is adjusted according to the desired emitted-light wavelength. For instance, to obtain a red light, the composition ratio x is made to be 0.15. The thickness of the n-type $Al_xGa_{1-x}As$ layer 16 is 2 µm (FIG. 2A, FIG. 2B and FIG. 2C).

The Zn diffusion regions 20 formed in the n-type $Al_xGa_{1-x}As$ layer 16 have a Zn concentration of $5 \times 10^{19}$ atoms/cm$^3$, and the depth of the diffusion regions 20 is about 1 µm (FIG. 2A and FIG. 2B).

In the embodiment under consideration, a plurality of isolation regions 22 are present, which extend from the n-type $Al_xGa_{1-x}As$ layer 16 to at least the surface of the non-doped compound semiconductor layer 15, and provide separation into block regions 23 containing an identical number of light-emitting regions 21, and isolation between the block regions (FIG. 1 and FIG. 2B).

Figure 3A:
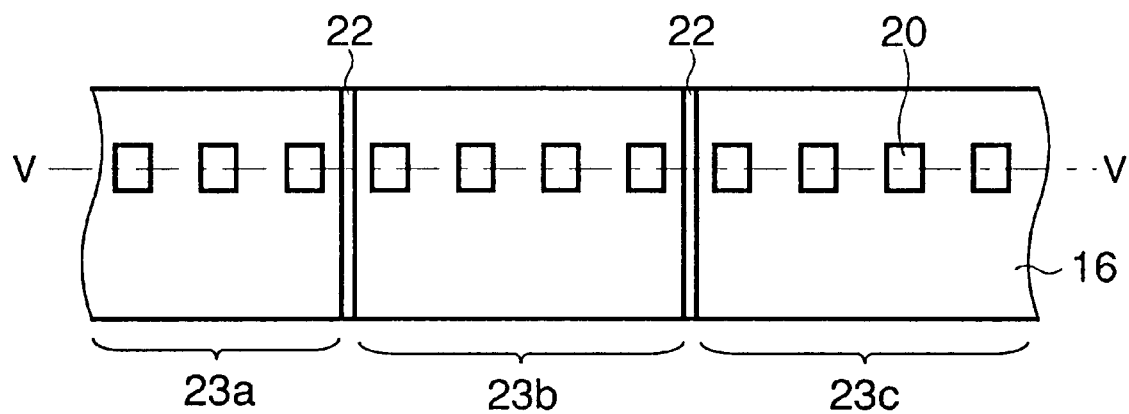
FIG. 3A is a plan view showing diffusion regions provided in one chip.
Figure 3B:
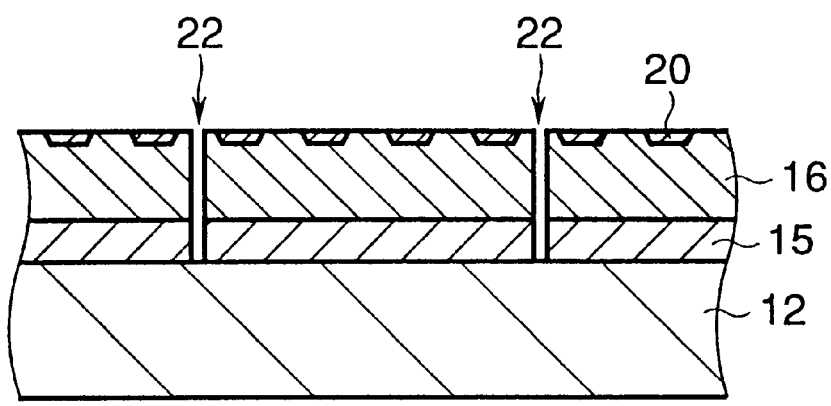
FIG. 3B is a sectional view taken along line V—V in FIG. 3A.
Figure 4:
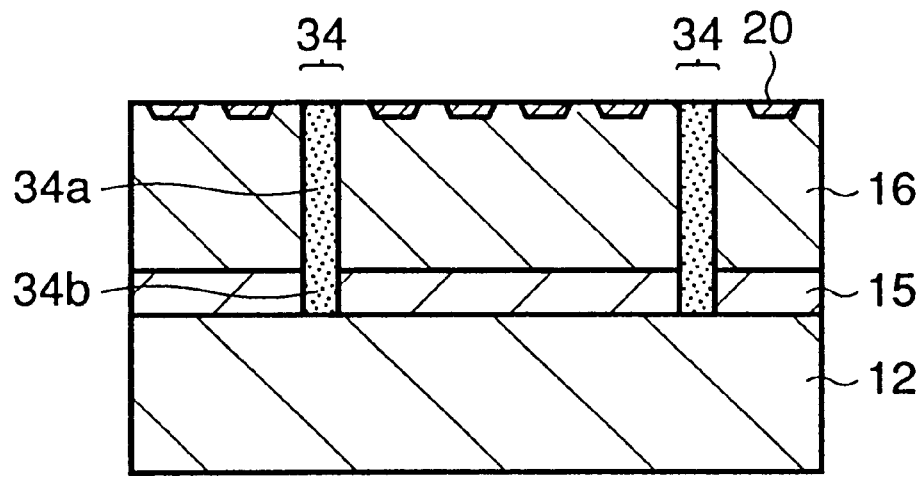
FIG. 4 is a schematic sectional view illustrating diffusion regions in another embodiment of the invention.

The isolation regions will next be described with reference to FIG. 3A, FIG. 3B, and FIG. 4. FIG. 3A is a plan view for explaining the structure of the isolation regions of the first embodiment. FIG. 3B is a sectional view along line V—V in FIG. 3A. FIG. 3A and FIG. 3B show part only of the LED array in one chip, and electrodes and the like are omitted.

The isolation regions 22 are provided to separate the light-emitting regions 21 into groups G each having an equal number of light-emitting regions 21. In the first embodiment, the isolation regions 22 are formed of isolation channels filled with an insulating material. The isolation channels 22 are provided at a certain interval so that every four light-emitting regions 21 form one group G, and each channel 22 is provided between the light-emitting regions 21 and in parallel with the individual electrodes 26 (FIG. 1), and the depth of the channel is from the surface of the n-type $Al_xGa_{1-x}As$ layer 16 to the surface of the n-type silicon substrate 12. Although the depth is shown to be to the surface of the n-type silicon substrate 12 in order to enhance the electric isolation, the depth may alternatively be to an intermediate point of the non-doped compound semiconductor layer 15 if this provides a sufficient electric isolation.

To form the isolation channel 22, for example, an etching mask (not shown) having apertures is formed on the n-type $Al_xGa_{1-x}As$ layer 16, and the non-doped compound semiconductor layer 15 and the n-type $Al_xGa_{1-x}As$ layer 16 are etched by anisotropic etching to form the channels 22 (FIG. 3A and FIG. 3B).

In this embodiment, the isolation channels 22 are provided so that the n-type $Al_xGa_{1-x}As$ layer 16 of each block region contains four light-emitting regions 21. By providing a plurality of isolation regions 22 in the LED array, the n-type $Al_xGa_{1-x}As$ layer 16 is separated into a plurality of block regions (first to third block regions 23a, 23b, 23c, in the illustration) each of which contains four light-emitting regions 21 and which are electrically isolated from each other. Moreover, in the illustrated embodiment, an equal number of light-emitting regions 21 are provided in each block region 23 (FIG. 3A and FIG. 3B).

The isolation channels 22 are filled with the same material as an interlayer insulating layer 30 which is formed on an insulating film 24, which is formed on the first compound semiconductor layer 16.

Second Embodiment

The structure of the isolation region according to the second embodiment will next be described with reference to FIG. 4.

In the second embodiment, an impurity is diffused into the non-doped GaAs layer 13 and the n-type $Al_xGa_{1-x}As$ layer 16 to form the isolation regions 34. Each of the diffusion regions 34 is formed of a first diffusion region 34a and a second diffusion region 34b. The first diffusion region 34a is a p-type $Al_xGa_{1-x}As$ region and the second diffusion region 34b is a p-type GaAs region.

For forming the first and second diffusion regions 34a and 34b, for example zinc (Zn) is diffused by vapor-phase or solid-phase diffusion into the n-type $Al_xGa_{1-x}As$ layer layer 16, the non-doped $Al_yGa_{1-y}As$ layer 14, and the non-doped GaAs layer 13. In this embodiment, the total thickness of the GaAs layer 13, the non-doped $Al_yGa_{1-y}As$ layer 14, and the $Al_xGa_{1-x}As$ layer 16 is about 3.5 μm, so the isolation regions 34 can be readily formed, from the surface of the $Al_xGa_{1-x}As$ layer 16 to at least the surface of the GaAs layer 13, by vapor-phase or solid-phase diffusion using an appropriate mask.

Referring again to FIG. 1 and FIG. 2A to FIG. 2C, electrode lines will now be described.

As illustrated, a plurality of shared electrode lines 32 are provided, which are connected via individual electrodes 26 to the diffusion regions 20 in all the block regions 23 (which are denoted by 23a, 23b, and 23c for distinction from each other) in such a manner that each diffusion region 20 in each block region 23 is connected to one shared electrode line 32. In other words, and one of the diffusion regions 20 is selected from each of the respective block regions 23 and the selected diffusion regions 20 are connected to a common shared electrode line 32.

In this embodiment, the n-type $Al_xGa_{1-x}As$ layer 16 in one block region 23 contains four light-emitting regions 21, so that the number of the shared electrode lines 32 is four, which is equal to the number of the light-emitting regions 21 in each block region. In FIG. 1, the four shared electrode lines 32 are denoted by 32a, 32b, 32c and 32d for distinction from each other. In FIG. 1, the four individual electrodes 26 in each block regions 23 are denoted by 26a, 26b, 26c and 26d for distinction from each other. The respective diffusion regions 20 in each block region are connected via different individual electrodes 26 to different shared electrode lines 32.

In this embodiment, the shared electrode line 32a and the individual electrode 26a in each block region are electrically connected via a wiring connecting part 33a, the shared electrode line 32b and the individual electrode 26b in each block region are electrically connected via a wiring connecting part 33b, the shared electrode line 32c and the individual electrode 26c in each block region are electrically connected via a wiring connecting part 33c, and the shared electrode line 32d and the individual electrode 26d in each block region are electrically connected via a wiring connecting part 33d.

The interlayer insulating film 30 is provided between the individual electrodes 26 and the electrode lines 32, and the individual electrodes 26 and the electrode lines 32 are connected via the wiring connecting parts 33 (only one being shown in FIG. 2A). Each of the respective shared electrode lines 32a, 32b, 32c and 32d is provided with at least one electrode pad (not shown).

In each of the block regions 23 (23a, 23b, 23c), an n-type block electrode 28 (28a, 28b, 28c) connected to the n-type $Al_xGa_{1-x}As$ layer 16 is provided on the n-type $Al_xGa_{1-x}As$ layer 16, and the block electrode 28 (28a, 28b, 28c) is connected to a block electrode pad 29.

The LED array of the embodiment described above employs a wiring arrangement in which diffusion regions selected from each of the block regions 23 are connected to shared electrode lines 32, in other words, a matrix wiring. Accordingly, the number of the electrode pads (not shown) can be substantially reduced.

To cause a selected light-emitting region to emit light, using the LED array described above, a voltage is applied to the shared electrode line 32 connected to the diffusion region of the selected light-emitting region 21, and the block electrode 28 for the block containing the selected light-emitting region 21. In this way, light emission of each light-emitting region 21 is turned on and off.

In the above-described LED array, the connection of the shared electrode lines and the individual electrodes 26 is such that the left electrode 26a in each of the block regions 23 is connected to the shared electrode line 32a positioned closest to the diffusion regions 20, the second electrode 26b from the left, in each of the block regions 23 is connected to the shared electrode line 32b positioned next closest to the diffusion regions 20, the third electrode 26c from the left, in each of the block regions 23 is connected to the shared electrode line 32c positioned third closest to the diffusion regions 20, and the electrode 26d at the right end in each of the block regions 23 is connected to the shared electrode line 32d positioned last closest to the diffusion regions 20. But the invention is not limited to such a connection. For instance, each of the shared electrode lines may be connected to the diffusion regions at different positions in different block regions 23. For instance, one of the shared electrode lines, say 32a, may be connected to the second electrode 26b from the left in the second block region 23b and the electrode 26a at the left end in the third block region 23c.

In the embodiments described, it was assumed that the shared electrode lines 32 are shared by all the block regions throughout the LED array. However, the LED array or chip may be divided into sections, and different sets of shared electrode lines 32 may be provided for the respective sections, and the shared electrode lines 32 may be shared only within each section.

In the first and second embodiments, in place of the silicon substrate, an SOI substrate comprising an insulating layer and a silicon layer on the insulating layer may be used.

Third Embodiment

Figure 5:
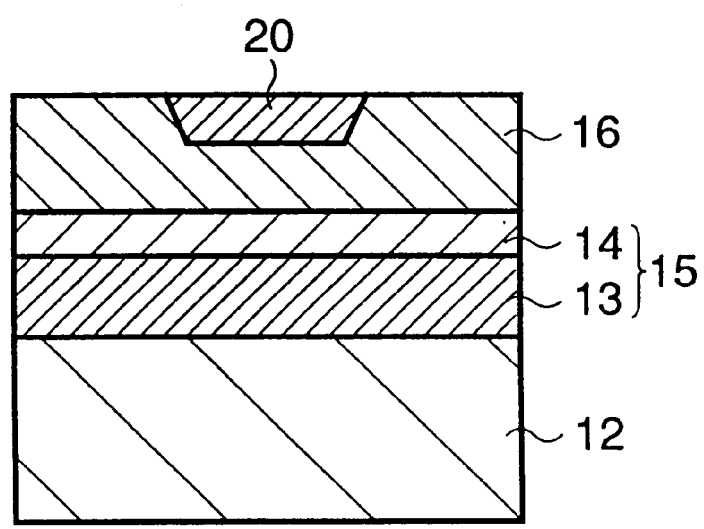
FIG. 5 is a sectional view illustrating an LED element of a further embodiment of the invention.
Figure 6A:
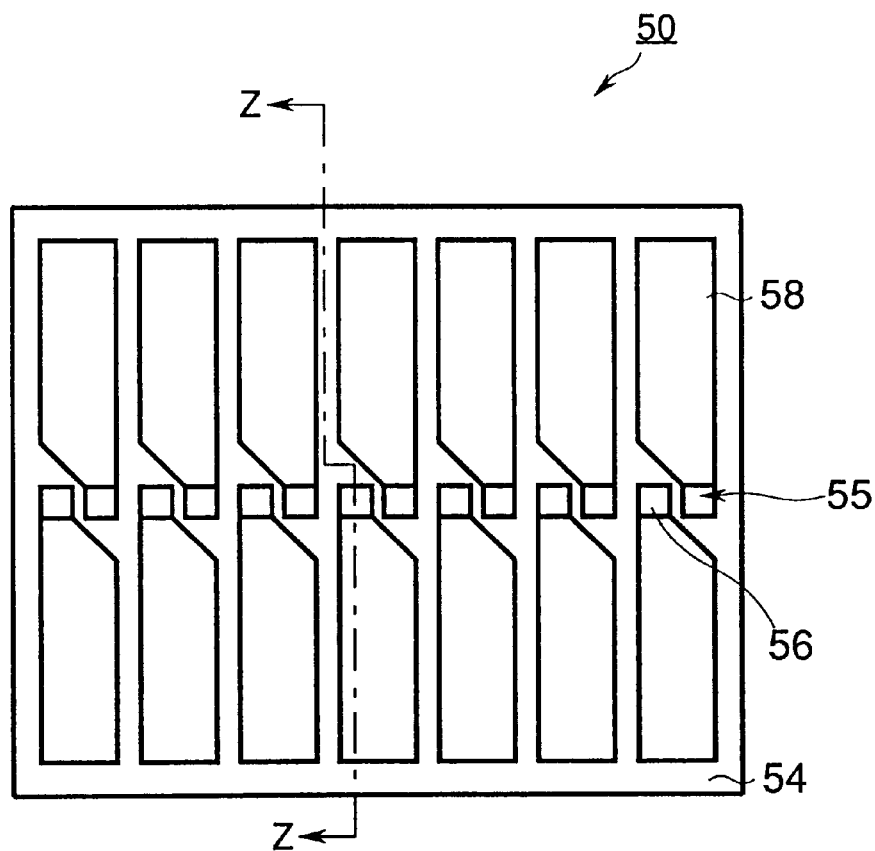
FIG. 6A is a plan view showing a conventional LED array.
Figure 6B:
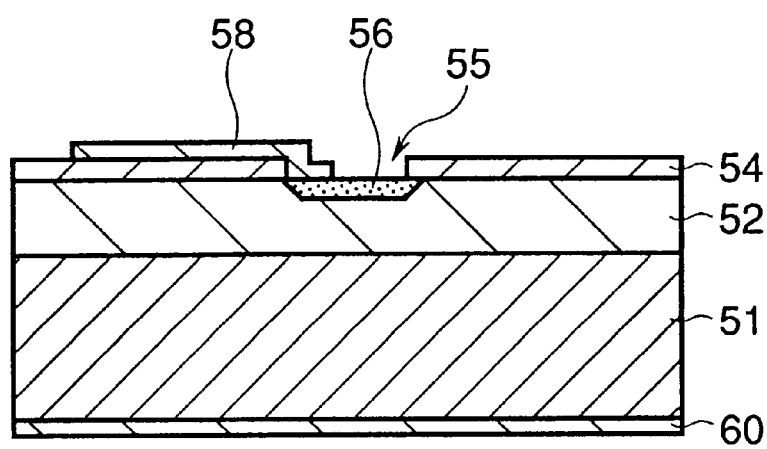
FIG. 6B is a sectional taken along line Z—Z in FIG. 6A.

An LED element which may be used in an LED array will next be described with reference to FIG. 5. FIG. 5 is a sectional view illustrating the pertinent part of the LED element used in the LED array.

The LED element comprises an n-type silicon substrate 12, a first compound semiconductor layer 16 of the first conductivity type, and a non-doped compound semiconductor layer 15 between the substrate 12 and the first compound semiconductor layer 16.

The first compound semiconductor layer 16 is an n-type $Al_xGa_{1-x}As$ layer.

In place of the n-type silicon substrate, an SOI (silicon on insulator) substrate may be used. Because an n-type silicon substrate or an SOI substrate is used, the possibility of the substrate being broken during dicing is reduced, and the handling during manufacture is easy.

Moreover, because the substrate is flat, and the possibility of cracks being generated in the substrate (wafer) during dicing is low, the process steps for dicing can be automated. Moreover, accuracy and evenness of the elements in the photolithography process can be fully ensured.

The speed of dicing can be increased, and the throughput can be improved. Moreover, in the dicing step, the breakage of the wafer is reduced, and the cutting can be achieved with a high accuracy. Furthermore, a wafer can be of a diameter of 3 inches (about 7.62 cm) or more, which cannot be realized with a compound semiconductor substrate. In addition, the cost of the substrate can be lowered compared with the conventional compound semiconductor substrate alone. Accordingly, the cost per chip can be lowered.

In this embodiment, the non-doped compound semiconductor layer 15 is formed of two layers, that is, the non-doped GaAs layer 13 and the non-doped $Al_yGa_{1-y}As$ layer 14. The composition ratio y of the $Al_yGa_{1-y}As$ layer 14 is larger than or equal to the composition ratio x of the n-type $Al_xGa_{1-x}As$ layer 16. That is, $1>y\geq x>0$.

By thus making the composition ratio y of the $Al_yGa_{1-y}As$ layer 14 larger than the composition ratio x of the n-type $Al_xGa_{1-x}As$ layer 16, the electrical resistance between the silicon substrate 12 and the n-type $Al_xGa_{1-x}As$ layer 16 can be enlarged. As a result, when a voltage is applied to the n-type $Al_xGa_{1-x}As$ layer 16 to cause an electric current to flow, thereby causing the the LED to emit light, no current is made to flow to the substrate, and the silicon substrate 12 and the n-type $Al_xGa_{1-x}As$ layer 16 can be electrically isolated.

In the above-described embodiment, an $Al_xGa_{1-x}As$ layer is used as the n-type compound semiconductor layer. This does not impose a limitation. Where a red light wavelength is desired, a GaAs layer may be used in place of the $Al_xGa_{1-x}As$ layer. In such a case, a non-doped GaAs layer, or a composite structure comprising a non-doped GaAs semicondcutor layer and a non-doped $Al_yGa_{1-y}As$ semiconductor layer, may be used as the non-doped compound semiconductor layer.

For obtaining an oscillation wavelength of visible light, a layer of a ternary (three-element) material such as a GaInAs, or a four-element material such as GaInAsP, may be used.

As has been described, according to the LED array of the invention, there are provided a non-doped compound semiconductor layer between the substrate at least a surface portion of which is formed of silicon, and a first compound semiconductor layer, isolation regions for separation into isolated block regions, and a plurality of shared electrode lines for commonly connecting to the diffusion regions in the respective block regions via electrodes of a second conductivity type. Moreover, the diffusion regions in each different block region are connected to a separate block electrode, so that the bonding pads need not be provided in the same number as the diffusion regions. The number of the bonding pads that need to be provided can be substantially reduced compared with the prior art.

Moreover, even if the density of the diffusion regions of the second conductivity type becomes high, the number of the bonding pads can be reduced. Accordingly, the connection with the driver IC via the bonding pads is facilitated. For this reason, the manufacturing yield is improved, and the cost of the products can be decreased.

Furthermore, because the surface portion of the substrate is silicon, a wafer of a large size can be used, and the chip cost can be lowered.

What is claimed is:

1. A light-emitting-diode array comprising:

a substrate;

a first compound semiconductor layer of a first conductivity type over said substrate;

diffusion regions of a second conductivity type provided in the first compound semiconductor layer to form light-emitting regions;

a non-doped compound semiconductor layer interposed between the substrate and the first compound semiconductor layer;

a plurality of isolation regions extending from the first compound semiconductor layer at least to a surface of the non-doped compound semiconductor layer, and separating the first compound semiconductor layer into block regions which contain an identical number of said diffusion regions and which are electrically isolated from each other; and a plurality of shared electrode lines connected to the diffusion regions in a plurality of the block regions via individual electrodes, in such a manner that one shared electrode line is connected to a selected one of the diffusion regions in each of the block regions, wherein at least a surface portion of said substrate is formed of silicon, and wherein said non-doped compound semiconductor layer is formed of a two-layer structure consisting of a non-doped GaAs layer formed on the substrate, and a non-doped $Al_yGa_{1-y}As$ layer (where y represents the composition ratio and has a value satisfying 0<y<1) formed on the non-doped GaAs layer.

2. The light-emitting-diode array according to claim 1, wherein said isolation regions are formed of isolation channels having a depth extending from said first compound semiconductor layer at least to said non-doped compound semiconductor layer.

3. The light-emitting-diode array according to claim 1, further comprising a block electrode provided in each of said block regions, wherein said block electrode is of said first conductivity type, and is provided on and electrically connected to said first compound semiconductor layer.

4. The light-emitting-diode array according to claim 1, wherein said first compound semiconductor layer is an $Al_xGa_{1-x}As$ layer (where x represents the composition ratio and has a value satisfying 0<x<1).

5. The light-emitting-diode array according to claim 1, wherein said first compound semiconductor layer is an $Al_xGa_{1-x}As$ layer (where x represents the composition ratio and has a value satisfying 0<x<1), and wherein y≧x.

6. The light-emitting-diode element according to claim 1, wherein said substrate is a silicon substrate.

7. A light-emitting-diode array comprising:

a substrate;

a first compound semiconductor layer of a first conductivity type over said substrate;

diffusion regions of a second conductivity type provided in the first compound semiconductor layer to form light-emitting regions;

a non-doped compound semiconductor layer interposed between the substrate and the first compound semiconductor layer;

a plurality of isolation regions extending from the first compound semiconductor layer at least to a surface of the non-doped compound semiconductor layer, and separating the first compound semiconductor layer into block regions which contains an identical number of said diffusion regions and which are electrically isolated from each other; and a plurality of shared electrode lines connected to the diffusion regions in a plurality of the block regions via individual electrodes, in such a manner that one shared electrode line is connected to a selected one of the diffusion regions in each of the block regions, wherein at least a surface portion of said substrate is formed of silicon, and wherein said isolation regions are formed of a first isolation region of a second conductivity type that is different from said first conductivity type of said first compound semiconductor layer, and a second isolation region formed by diffusing an impurity of the second conductivity type in said non-doped compound semiconductor layer.

8. A light-emitting-diode element comprising:

a substrate;

a first compound semiconductor layer of a first conductivity type over said substrate;

a diffusion region of a second conductivity type provided in the first compound semiconductor layer to form a light-emitting region; and at least one non-doped compound semiconductor layer provided between the substrate and the first compound semiconductor layer, wherein at least a surface portion of said substrate is formed of silicon, and wherein said at least one non-doped compound semiconductor layer comprises a two-layer structure consisting of a non-doped GaAs layer formed on the substrate, and a non-doped $Al_yGa_{1-y}As$ layer (where y represents the composition ratio and has a value satisfying 0<y<1) formed on the non-doped GaAs layer.

9. The light-emitting-diode element according to claim 8, wherein said first compound semiconductor layer is an $Al_xGa_{1-x}As$ layer (where x represents the composition ratio and has a value satisfying 0<x<1).

10. The light-emitting-diode element according to claim 8, wherein said first compound semiconductor layer is an $Al_xGa_{1-x}As$ layer (where x represents the composition ratio and has a value satisfying 0<x<1), and wherein y≧x.

11. The light-emitting-diode element according to claim 8, wherein said substrate is a silicon substrate.

12. A light-emitting-diode element, comprising:

a substrate having a silicon surface portion;

a GaAs layer on the surface portion of the substrate;

an $Al_yGa_{1-y}As$ layer on the GaAs layer;

a compound semiconductor layer on the $Al_yGa_{1-y}As$ layer, the compound semiconductor layer having a first conductivity type; and a diffusion region of a second conductivity type in the compound semiconductor layer to provide a light-emitting region.

13. The light-emitting-diode element of claim 12, wherein the compound semiconductor layer is an $Al_xGa_{1-x}As$ layer, x being smaller than y.

14. The light-emitting-diode element of claim 12, in combination with a plurality of additional light-emitting-diode elements which comprise respective additional diffusion regions of the second conductivity type in the compound semiconductor layer.

15. The combination of claim 14, wherein all of the light-emitting diode elements are disposed in a row, and further comprising means for electrically isolating groups of light-emitting diode elements from one another, each of the groups having an equal number of the light-emitting-diode elements, and wiring means for conveying electrical energy to the light-emitting-diode elements.

16. The combination of claim 15, wherein the wiring means comprises a plurality of block electrodes, each of the block electrodes corresponding to one of the groups and being connected to all of the light-emitting-diode elements in the corresponding group, a plurality of shared electrodes which extend substantially parallel to the row of light-emitting-diode elements, and a plurality of individual electrodes, the individual electrodes connecting each of the shared electrodes to one of the light-emitting-diode elements in each of the groups.

* * * * *